United States Patent [19]
Tsai et al.

[11] Patent Number: 6,159,838
[45] Date of Patent: Dec. 12, 2000

[54] METHOD OF PERFORMING REWORK TEST ON INTEGRATED CIRCUIT PACKAGES

[75] Inventors: Ming-Cheng Tsai, TaoYuan Hsien; Heng-Chen Ho, Taipei, both of Taiwan

[73] Assignee: VIA Technologies, Inc., Hsin-Tien, Taiwan

[21] Appl. No.: 09/286,216

[22] Filed: Apr. 5, 1999

[30] Foreign Application Priority Data

Aug. 3, 1998 [TW] Taiwan .................................. 87112733

[51] Int. Cl.⁷ .................................................. H01L 21/288
[52] U.S. Cl. .......................... 438/616; 438/616; 257/778; 257/737
[58] Field of Search ............................. 438/616; 257/778, 257/737, 688, 668, 734, 736, 738, 750, 773, 781, 48

[56] References Cited

U.S. PATENT DOCUMENTS

| 5,125,509 | 6/1992 | Takei et al. | 206/332 |
| 5,173,766 | 12/1992 | Long et al. | 257/687 |
| 5,258,575 | 11/1993 | Beppu et al. | 174/52 |
| 5,376,588 | 12/1994 | Pendse | 437/211 |
| 5,675,179 | 10/1997 | Shu et al. | 257/668 |
| 5,702,224 | 12/1997 | Kubota | 414/403 |
| 5,836,454 | 11/1998 | Evers | 206/723 |
| 5,872,051 | 2/1999 | Fallon et al. | 438/616 |
| 5,925,934 | 7/1999 | Lim | 257/778 |
| 5,996,805 | 12/1999 | Evers | 206/723 |

*Primary Examiner*—Charles Bowers
*Assistant Examiner*—Laura M Schillinger
*Attorney, Agent, or Firm*—J. C. Patents; Jiawei Huang

[57] ABSTRACT

A method for performing rework test on integrated circuit (IC) packages is provided. By this method, the first step is to remove a selected part of the casing of the IC package to form an opening in the casing to expose the IC chip contained in the casing. Then, an adhesive layer, such as a double adhesive tape, is attached over the casing on the side where the opening is formed. Then, a heat-insulative cover, such as a ceramic cover, is adhered to the double adhesive tape. After this, the entire IC package is mounted by solder on a test circuit board, allowing a function test procedure to be performed on the internal circuitry of the IC chip contained in the casing. During the function test procedure, when necessary, the ceramic cover can be easily and effortlessly detached to allow the test engineer to visually inspect the inside IC chip for any structural problems.

22 Claims, 2 Drawing Sheets

METHOD OF PERFORMING REWORK TEST ON INTEGRATED CIRCUIT PACKAGES

CROSS-REFERENCE TO RELATED APPLICATION

This application claims the priority benefit of Taiwan application serial no. 87112733, filed Aug. 3, 1998, the full disclosure of which is incorporated herein by reference.

BACKGROUND OF THE INVENTION

1. Field of the Invention

This invention relates to integrated circuit technology, and more specifically, to a method for performing rework test on integrated circuit (IC) packages, which allows the exposed IC chip contained in the casing of the IC package to be covered up before being mounted on a dedicated test circuit board to undergo function test procedure so as to prevent the inside IC chip from being damaged during the desoldering process, and thereafter allows the cover to be easily and effortlessly detached to allow the test engineer to visually inspect the inside IC chip for any structural problems. This method is particularly useful for performing rework test on IC packages of the ball grid array (BGA) and plastic quad flat package (PQFP) technologies.

2. Description of Related Art

A module IC package integrates one or more IC chips in one single package. Within the IC package, each IC chip is connected to a large number of bonding wires; and therefore, each single IC package typically requires hundreds of wires to interconnect the various IC chips therein. Conventional packaging technologies include, for example, flat package, hermetic and plastic chip carrier, grid array package, quad flat package (QFP), and plastic quad flat package (PQFP), to name just a few.

With conventional IC packaging technology, an IC chip is mounted on a leadframe and then the entire IC chip together with the leadframe are hermetically enclosed in a casing to form a complete IC package. However, with new advances in semiconductor technologies, the functionality of a single IC chip is significantly increased as compared to the earlier types of ICs. This leads to an increase in the total number of bonding wires required to connect the IC chip in the IC package, which would make the packaging more difficult to carry out.

One solution to the foregoing problem is the so-called ball grid array (BGA) technology, which packages an IC chip in a square casing with the tips of the connecting pins being attached with tiny solder balls. When mounting a BGA package on a printed wire board or a printed circuit board, the solder balls are heated to melt, thereby allowing the connecting pins of the BGA package to be conveniently soldered to the bonding pads on the circuit board.

A BGA package is a miniature multilevel printed circuit board on which a plurality of IC chips are mounted. These IC chips are interconnected via printed conductive paths and metal plugs with each other.

In the event that an IC package fails to operate properly after being used for some time, a rework test is customarily performed on the IC package so as to check the functional and structural integrity of the internal circuitry of the IC package. In the rework test, the IC package is typically mounted on a dedicated test circuit board. Moreover, it is usually desired to visually inspect the inside IC chip contained in the casing of the IC package to see if there are any structural defects. To do this, the casing of the IC package should be partly removed to expose the inside IC chip contained in the casing of the IC package.

A conventional way to expose the inside IC chip is to use a high-temperature and high-concentration erosive acid to erode away a selected part of the casing. After this, heated gas and infrared heating means are used together to solder the entire IC package onto the test circuit board. One drawback to this method, however, is that the exposure of the inside IC chip to the heated gas and infrared light can cause the IC chip to be damaged, resulting in open circuits and short circuits in the internal circuitry of the IC chip.

If the IC package is soldered onto the test circuit board prior to exposing the inside IC chip, then the use of the high-temperature erosive acid to remove part of the casing to expose the inside IC chip would easily damage the nearby circuit components on the test circuit board or even the internal wiring in the IC package. One solution to this problem is to position the test circuit board in an upside-down manner and spread the erosive acid upwards onto the casing of the IC package from the bottom side. This scheme, however, is quite difficult to carry out, in that the failure rate is pretty high and the erosive acid can nonetheless easily spread to nearby circuit components on the test circuit board. Therefore, this solution is not quite feasible.

Another solution to the foregoing problem is to cover the opening in the casing with a heat-insulative ceramic cover, and then use adhesive tapes or glues to secure the ceramic cover tightly in position to thereby hermetically seal the inside IC chip from the ambient environment for the purpose of preventing the inside IC chip from exposing to heated gas and infrared light when soldering the IC package onto the test circuit board. This solution, however, is somewhat difficult to carry out, in that, during the soldering process, the heated gas would typically heat the casing of the IC package up to 290° C. to 310° C., and ordinary adhesive tapes or glues would be melted at these temperature levels. The melt can even flow into the inside of the casing and then spread onto the IC chip, thus causing damage to the IC chip. Moreover, the ceramic cover should be air-tightly mounted on the casing of the IC package; otherwise, the heated gas and infrared light can still permeate into the inside of the IC package, causing damage to the inside IC chip.

As a summary, the prior art has the following drawbacks that need to be improved.

(1) First, the scheme of exposing the inside IC chip prior to the mounting of the IC package on the test circuit board would cause the inside IC chip to be easily damaged by the heated gas and infrared light when mounting the IC package onto the test circuit board, resulting in short and open circuits in the internal circuitry of the IC chip.

(2) Second, the scheme of soldering the IC package prior to the selective removal of the casing of the IC package to expose the inside IC chip would easily cause the erosive acid to be spread onto the IC chip, thus causing damage to the IC chip.

(3) Third, in the scheme of air-tightly mounting a ceramic cover by adhesive tapes or glues, the adhesive tapes or glues can be easily melted away when the IC package is heated up to from 290° C. to 310° C., thus breaking up the airtightness. Moreover, the melt would easily flow into the inside of the IC package and spread onto the IC chip, thus causing damage to the IC chip.

(4) Fourth, in the scheme of using adhesive tapes or glues to secure the ceramic cover in position on the casing of the IC package after exposing the inside IC chip, the same problems described above would also occur, i.e., the adhesive tapes or glues can be easily melted away when the IC package is heated up to from 290° C. to 310° C., thus breaking up the air-tightness, and the melt would then easily flow into the inside of the IC package and spread onto the IC chip, thus causing damage to the IC chip, resulting in short and open circuits in the internal circuit of the IC chip. Moreover, it would make the ceramic cover difficult to be dismounted to allow the test engineer to visually inspect the inside IC chip.

SUMMARY OF THE INVENTION

It is therefore an objective of the present invention to provide a method of performing rework test on IC packages, which can allow the chip-exposed IC package to be mounted on the test circuit board without causing damage to the inside IC chip, and also allows the test engineer to visually inspect the inside IC chip in a convenient manner.

It is another objective of the present invention to provide a method of performing rework test on IC packages, which can help solve the problem caused by soldering the IC package on the test circuit board prior to exposing the inside IC chip that can otherwise cause damage to the inside IC chip by erosive acid.

It is still another objective of the present invention to provide a method of performing rework test on IC packages, which allows the ceramic cover to be air-tightly mounted on the casing of the IC package so as to prevent the inside IC chip from exposing to heated gas and infrared light, while nonetheless allowing the ceramic cover to be easily and effortless detached to allow the test engineer to visually inspect the inside IC chip for any structural problems.

In accordance with the foregoing and other objectives of the present invention, a new method for performing rework test on IC packages is provided. By the method of the invention, the first step is to remove part of the casing of the IC package to form an opening in the casing to expose the IC chip contained in the casing. Next, a low-frequency test is performed on the internal circuitry of the IC chip. This preliminary test can be performed without having to solder the IC package. Next, an adhesive layer, such as a double adhesive tape, is adhered over the casing on the side where the opening is formed, preferably around the opening. Then, a heat-insulative cover is adhered to the other side of the double adhesive tape to cover up the IC chip. After this, the next step is to mount the entire IC package on a test circuit board; and then a function test procedure is performed on the internal circuitry of the IC chip contained in the casing. During this function test procedure, when necessary, the cover can be manually dismounted to allow the test engineer to visually inspect the inside IC chip contained in the casing.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
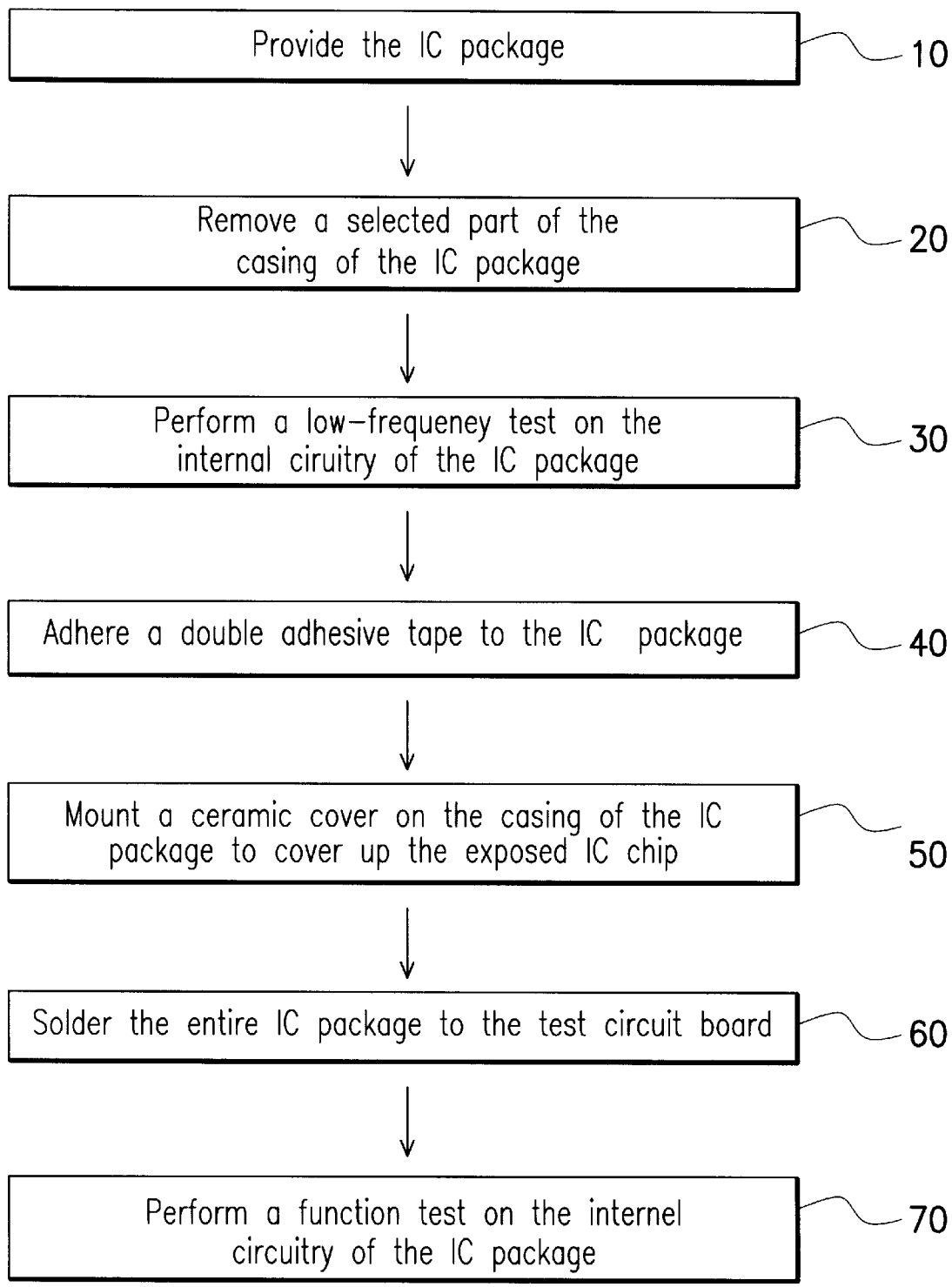
FIG. 1 is a flow diagram showing the procedural steps involved in the method of the invention for performing a rework test on an IC package.

FIG. 1 is a flow diagram showing the procedural steps involved in the method of the invention for performing a rework test on an IC package; and FIGS. 2A–2D are schematic perspective diagrams used to depict the IC package at each stage of the rework test according to the invention.

Figure 2A:
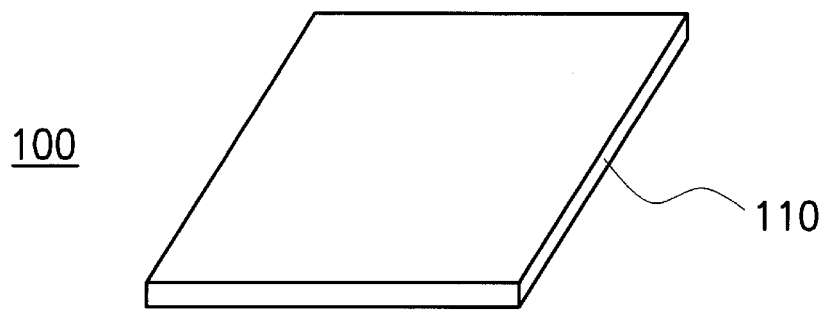
FIGS. 2A–2D are schematic perspective diagrams used to depict the IC package at each stage of the rework test according to the invention.

Referring to FIG. 1 together with FIGS. 2A–2D, in the initial step 10, an IC package 100 with a plastic casing 110 as illustrated in FIG. 2A is provided for rework test. This IC package 100 is, for example, one that is abnormal in operation needing to be repaired.

Figure 2B:
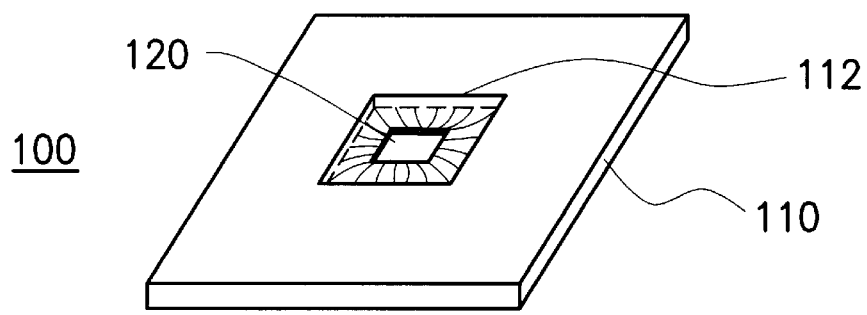

In the next step 20, a selected part of the plastic casing 110 is removed by using, for example, a high-temperature erosive acid, so as to form an opening 112 through the plastic casing 110 to expose the inside IC chip 120 contained in the IC package 100 as illustrated in FIG. 2B.

In the next step 30, a low-frequency test is performed on the internal circuitry of the IC chip 120 to check the response of the internal circuitry of the IC chip 120. This low-frequency test can be carried out without having to mount the IC package 100 on a test circuit board. If the test result is OK, the procedure then goes to the next step 40.

Figure 2C:
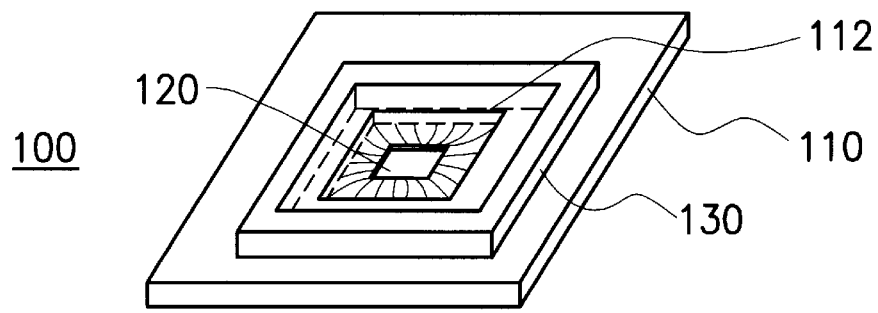

In the step 40, an adhesive layer, such as a double adhesive tape 130 (with adhesive coatings on both sides), is adhered around the opening 112 in the plastic casing 110 as illustrated in FIG. 2C.

Figure 2D:
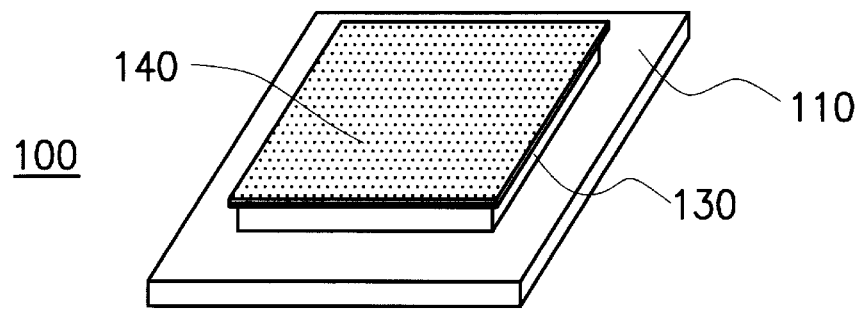

In the next step 50, a heat-insulative cover, such as a ceramic cover 140, is securely mounted over the opening 112 by adhering it to the double adhesive tape 130 so as to cover up the inside IC chip 120 contained in the plastic casing 110, as illustrated in FIG. 2D.

In the next step 60, the entire IC package 100 is soldered onto a test circuit board (not shown) by first mounting the IC package 100 at a specified position on the test circuit board (not shown), and then heating the IC package 100 to a temperature of from 290° C. to 310° C. by placing the IC package 100 in a heated gas environment and illuminating the IC package 100 with infrared. Under this high-temperature treatment, tin balls (not shown) on the tips of the connecting pins (not shown) of the IC package 100 can be melted to thereby solder the IC package 100 onto the test circuit board (not shown).

In the next step 70, a function test procedure is performed by applying certain electrical signals through the test circuit board (not shown) to the internal circuitry of the IC chip 120 contained in the IC package 100 so as to check for any functional problems of the internal circuitry of the IC chip 120. During this function test procedure, the ceramic cover 140 can be detached easily and effortlessly by the test engineer to allow the test engineer to visually inspect the IC chip 120 for any structural problems.

With the use of the double adhesive tape 130, the ceramic cover 140 can be air-tightly mounted on the plastic casing 110 simply by pressing the ceramic cover 140 slightly forcefully against the plastic casing 110, which allows the double adhesive tape 130 therebetween to air-tightly adhere to both of the ceramic cover 140 and the plastic casing 110. This can help prevent the inside IC chip 120 from exposing to the heated gas and infrared light used in the step 60 that would otherwise cause damage to the IC chip 120. Moreover, since the double adhesive tape 130 is covered by the heat-insulative ceramic cover 140, the double adhesive tape 130 is effectively heat-isolated from the high-temperature environment when soldering the IC package 100 onto the test circuit board (not shown), and therefore would not be melted down at the high temperature level of about 300° C. as in the case of the prior art. Still moreover, the double adhesive tape 130 is typically of the quality that allows the adhered ceramic cover 140 to be easily and effortlessly detached therefrom. Therefore, the ceramic cover 140 can be conveniently detached during the function test procedure to allow the test engineer to visually inspect the inside IC chip 120. Compared to the prior art, the invention is undoubtedly more advantageous.

In conclusion, the invention provides a method for performing rework test on an IC package that allows the IC package to be mounted onto the test circuit board without causing damage to the inside IC chip. With the invention, the success rate of the rework test has been proved to be more than 90%. As a summary, the invention has the following advantages over the prior art.

(1) First, the invention provides a method for performing rework test on IC packages, in which a double adhesive tape is used to dismountably secure a ceramic cover in position on the casing the IC package that is used to cover the exposed IC chip on the inside of the IC package. The invention is particularly useful for rework test on BGA and PQFP packages.

(2) Second, the invention allows the ceramic cover to be air-tightly mounted on the casing of the IC package to prevent the inside IC chip from exposing heated gas and infrared light when soldering the IC package to the test circuit board at a temperature of up to about 300° C.

(3) Third, the invention utilizes a widely available double adhesive tape to securely mount the ceramic cover in position on the casing of the IC package. The overall process of the rework test is therefore low in implementation cost.

(4) Fourth, the use of the double adhesive tape to securely mount the ceramic cover also allows the ceramic cover to be easily and effortlessly detached from the casing of the IC package to allow the test engineer to visually inspect the inside IC chip.

(5) Fifth, the invention allows the success rate of rework test to be more than 90%, which is considerably higher than that achievable by the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for performing a rework test on an IC package, comprising the steps of:
    removing a selected part of the casing of the IC package to form an opening in the casing to expose the inside IC chip contained in the casing;
    forming an adhesive layer over the casing on the side where the opening is formed;
    adhering a heat-insulative cover to the adhesive layer, which covers up the entire opening;
    mounting the entire IC package on a test circuit board; and
    performing a function test procedure on the internal circuitry of the IC chip contained in the casing, during which the heat-insulative cover is manually detachable to allow visual inspection for the inside IC chip contained in the casing of the IC package.

2. The method of claim 1, further comprising, after the opening in the casing is formed, the step of:
    performing a low-frequency test on the internal circuitry of the IC chip without mounting the IC package on a circuit board.

3. The method of claim 1, wherein the IC package is a BGA.

4. The method of claim 1, wherein the IC package is a PQFP.

5. The method of claim 1, wherein the casing is a plastic casing.

6. The method of claim 1, wherein the opening is formed by eroding the selected part of the casing with an erosive acid.

7. The method of claim 1, wherein the adhesive layer is a double adhesive tape.

8. The method of claim 1, wherein the adhesive layer is formed around the opening in the casing.

9. The method of claim 1, wherein the adhesive layer is a double adhesive tape adhering the heat-insulative cover in an air-tight manner to the casing.

10. The method of claim 1, wherein the heat-insulative cover is a ceramic cover.

11. The method of claim 1, wherein the heat-insulative cover is adhered in an air-tight manner to the adhesive layer.

12. The method of claim 1, wherein the IC chip contained in the casing is sealed in an air-tight manner by the heat-insulative adhered to the adhesive layer to prevent the exposure of the inside IC chip to heated air and infrared light.

13. A method for performing rework test on an IC package, comprising the steps of:
    removing a selected part of the casing of the IC package to form an opening in the casing to expose the IC chip contained in the casing;
    performing a preliminary test on the internal circuitry of the IC chip;
    forming a double adhesive tape over the casing on the side where the opening is formed;
    adhering a heat-insulative cover to the double adhesive tape, which covers up the entire opening;
    mounting the entire IC package on a test circuit board; and
    performing a function test procedure on the internal circuitry of the IC chip contained in the casing, during which the heat-insulative cover is manually detachable to allow visual inspection for the internal circuitry of the IC chip contained in the casing of the IC package.

14. The method of claim 13, wherein the preliminary test includes the substep of:
    performing a low-frequency test on the internal circuitry of the IC chip without mounting the IC package on a circuit board.

15. The method of claim 13, wherein the IC package is a BGA.

16. The method of claim 13, wherein the IC package is a PQFP.

17. The method of claim 13, wherein the casing is a plastic casing.

18. The method of claim 13, wherein the opening is formed by eroding the selected part of the casing with an erosive acid.

19. The method of claim 13, wherein the double adhesive tape is formed around the opening in the casing.

20. The method of claim 13, wherein the double adhesive tape is adhered in an air-tight manner to the casing of the IC package.

21. The method of claim 13, wherein the heat-insulative cover is adhered in an air-tight manner to the double adhesive tape.

22. The method of claim 13, wherein the IC chip contained in the casing is sealed in an air-tight manner by the heat-insulative cover adhered to the adhesive layer to prevent the exposure of the IC chip to heated air and infrared light.

* * * * *